United States Patent [19]

Nakagawara

[11] Patent Number: 5,223,743
[45] Date of Patent: Jun. 29, 1993

[54] ADAPTIVE CURRENT GENERATING TRANSCONDUCTANCE CIRCUIT

[75] Inventor: Chikashi Nakagawara, Kanagawa, Japan

[73] Assignee: Kabushiki Kaisha Toshiba, Kanagawa, Japan

[21] Appl. No.: 873,233

[22] Filed: Apr. 24, 1992

[30] Foreign Application Priority Data

Apr. 26, 1991 [JP]  Japan .................................. 3-096840

[51] Int. Cl.⁵ ......................... H03K 3/01; G06G 7/12
[52] U.S. Cl. .............................. 307/296.1; 307/296.6;
307/262; 307/490; 307/491; 307/494; 323/315; 323/316
[58] Field of Search ................... 307/262, 296.1, 296.6, 307/490.1, 494; 323/315–316

[56] References Cited

U.S. PATENT DOCUMENTS

| | | | |
|---|---|---|---|
| 4,127,783 | 11/1978 | Alaspa ................................. | 307/297 |
| 4,388,539 | 6/1983 | Boeke ................................. | 307/491 |
| 4,689,607 | 8/1987 | Robinson ........................... | 323/315 |
| 4,700,144 | 10/1987 | Thomson ........................... | 323/316 |
| 4,933,644 | 6/1990 | Fattaruso et al. ................ | 330/258 |

OTHER PUBLICATIONS

"Constant Current Source Generator" IBM Tech. Disc. Bul. vol. 19 No. 11 Apr. 1977 Blumberg et al.
"Current Source Generator" IBM Tech. Disc. Bul. vol. 12 No. 11 Apr. 1970 Keller et al.
IEEE Nov. 1983 Transactions on Consumer Electronics, vol. CE-29, No. 4, pp. 475-485 "Monolithic Filter and its application to TV MPX Sound Decoder IC"; Y. Ishigaki et al.
Kawano et al., IEEE Transactions on Consumer Electronics, vol. 35, No. 4, Nov. 1989.

*Primary Examiner*—William L. Sikes
*Assistant Examiner*—Margaret Rose Wambach
*Attorney, Agent, or Firm*—Finnegan, Henderson, Farabow, Garrett & Dunner

[57] ABSTRACT

An adaptive current generating circuit having a reference voltage supply circuit for supplying a reference voltage subjected to a fluctuation of supply voltage, a reference current supply circuit for supplying reference current responsive to the reference voltage supplied by the reference voltage supply circuit, a control current supply circuit for supplying control current subjected to the fluctuation of the supply voltage and a bias supply circuit for supplying a bias to the reference current supply circuit corresponding to a difference between the reference current supplied by the reference current supply circuit and the control current supplied by the control current supply circuit.

6 Claims, 6 Drawing Sheets

ADAPTIVE CURRENT GENERATING TRANSCONDUCTANCE CIRCUIT

FIELD OF THE INVENTION

The present invention relates generally to an adaptive current generating circuit, and more particularly, to an adaptive current generating circuit suited for stabilizing the transconductance of transconductance circuits.

BACKGROUND OF THE INVENTION

Conventionally, biquad system filter circuits and gyrator system filter circuits are well known as filter circuits suitable to fabricate in IC device. In these filter circuits, their time constants are defined by C/gm, wherein the C and gm are a capacitance of a capacitor and a transconductance of a transconductance circuit, respectively, constituting the filter circuit with each other. The filter characteristic of the filter circuit is optionally defined based on the time constant using a feedback technique. Therefore, in order to obtain a stable filter characteristic it is necessary to keep the time constant C/gm at a constant value.

In general, the capacitance C of capacitors fabricated in IC devices scatter over the order of several percents in relative value, while they further scatter up to several tens of percentages in absolute value. So, in order to keep the time constant C/gm constant, the transconductance gm of the transconductance circuit is required to be adjusted in proportion to the straggling of the capacitance C. In order to construct such a transconductance circuit suitable for IC built-in filters, a so-called gain cell circuit, whose transconductance gm changes in proportion to a bias current applied thereto, or an emitter-coupled differential circuit is conventionally used.

Shown in FIG. 1 is an exemplary gain cell circuit. The gain cell circuit comprises three pairs of transistors, i.e., a first pair of Q1 and Q2, a second pair of Q3 and Q4, and a third pair of Q5 and Q6. The emitters of the transistors Q1 and Q2 whose collectors are coupled to a supply voltage Vcc and also whose bases are coupled to an input signal are coupled to the collectors of the transistors Q3 and Q4 through resistors R1 and R2, respectively. The bases of the transistors Q3 and Q4 are coupled to their own collectors in diode fashion, while their emitters are commonly coupled to a first current source of current I1. Here the first current source will be designated by also I1. Further the collectors of the transistors Q3 and Q4 are coupled to the bases of the transistors Q5 and Q6. The emitters of the transistors Q5 and Q6 are commonly coupled to a second current source of current I2. Here the second current source will be designated by also I2.

Now assuming that the base current amplification factor $\beta$ of the each transistor is sufficiently large and the resistors R1 and R2 have the same value of resistance R, the transconductance gm of the gain cell circuit shown in FIG. 1 is then represented by Equation (1) in below;

$$gm = I2/[I1 \cdot (R + 2 \cdot Re)] \quad (1)$$

wherein the term Re represents a differentiated emitter resistance.

When the thermal voltage of the each transistor is given by VT, the differentiated emitter resistance Re of the transistors is represented as follows:

$$Re = 2 \cdot VT/I1$$

If $R >> Re$, the Equation 1 can be approximated as follows;

$$gm = I2/I1 \cdot R \quad (2)$$

Accordingly, the transconductance gm can be adjusted by changing the ratio between the current sources I1 and I2. Normally, the current I1 of the first current source is set in a fixed value while the current I2 of the second current source is set in a variable condition, because of easy setting of bias conditions required in response to the current adjustment.

FIG. 2 shows a typical version of the second current source I2 for supplying an adaptive current. As shown in FIG. 2, the second current source I2 comprises four transistors Q10 through Q13, a variable resistor VR, four resistors R10 through R13, and a power source of supply voltage Vcc. Here the power source will be designated also by the term Vcc. The emitter of the transistor Q10 is connected to the base of the transistor Q11. The base of the transistor Q10 is not only connected to the collector of the transistors Q11, but also connected to the reference potential GND through the resistor R10. The emitter of the transistor Q11 is coupled to the supply voltage Vcc through the resistor R11.

The variable resistor VR is connected across the series circuit of the resistor R11 and the emitter-base junction of the transistor Q11. Further, the collector of the transistor Q10 is connected to a current mirror circuit CM which includes the transistors Q12 and Q13 and the resistors R12 and R13. Thus the current I2 is obtained through the collector of the transistor Q13.

In the circuit shown in FIG. 2, if the resistance of the resistor R10 is assumed to be equal to that of the resistor R11 (R10=R11), the base-to-emitter voltages Vbe of all the transistors Q10 through Q14 are equal to each other, and their base currents Ib are negligibly small, the collector current Ic10 of the transistor Q10 will be represented as follows:

$$Ic10 = Vcc/2 \cdot VR \quad (3)$$

As assumed above that the current output from the current mirror circuit CM is subjected for the current I2 for the second pair of the transistors Q3 and Q4, the following equation is obtained from the above Equations 2 and 3;

$$gm = Vcc/2 \cdot I1 \cdot R \cdot VR \quad (4)$$

If the current I1 and the resistance R are constant, the transconductance gm will vary in proportion to the quotient only as follows:

$$gm \approx (Vcc/VR) \quad (5)$$

So if the supply voltage Vcc is stable, there is an advantage that the transconductance gm can be controlled stably at a desired value by the variable resistor VR.

However, in a practical arrangement of the IC built-in filters the respective terms of the Equation 4, i.e., the current I1 of the first current source, the resistance R of the resistors R1 and R2, and the supply voltage Vcc are not constant. Thus, the Equation 5 is hardly realized because of the transconductance gm depends on many variable factors other than the factor of the variable resistor VR.

Further, the differentiated emitter resistance Re is omitted from the Equation 2, but it heavily affects on the transconductance gm in the practical arrangement. These factors fluctuate independently of to the other factors.

In the practical arrangement, therefore, the transconductance gm can not sufficiently controlled by only the current source as shown in FIG. 2. Thus many other circuits have been required in the practical arrangement of such gain cell circuits or the current adjusting circuits.

In the above discussion, such a gain cell circuit has exemplified transconductance circuits. However when an emitter-coupled differential circuit is used, there will occur another problem that a bias current for actuating the circuit must be changed in order to keep the transconductance gm so that the current source as shown in FIG. 2 cannot intrinsically achieve with the stabilization of the transconductance.

The conventional adaptive current generating circuit thus can not sufficiently stabilize the transconductance of the transconductance circuit, so that many complicated stabilizing circuits are required, resulting in an increase in circuit scale. While when the emitter-coupled differential circuit was used as the transconductance circuit, no stabilization of transconductance could be intrinsically achieved.

SUMMARY OF THE INVENTION

It is, therefore, an object of the present invention to provide an adaptive current generating circuit which is capable of controlling transconductance of various transconductance circuits stably with a relatively simple circuit.

Another object of the present invention is to provide an adaptive current generating circuit suited for reference current sources for IC built-in filters.

In order to achieve the object, an adaptive current generating circuit having a reference voltage supply circuit for supplying a reference voltage subjected to a fluctuation of supply voltage, a reference current supply circuit for supplying reference current responsive to the reference voltage supplied by the reference voltage supply circuit, a control current supply circuit for supplying control current subject to the fluctuation of the supply voltage and a bias supply circuit for supplying a bias to the reference current supply circuit corresponding to a difference between the reference current supplied by the reference current supply circuit and the control current supplied by the control current supply circuit.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
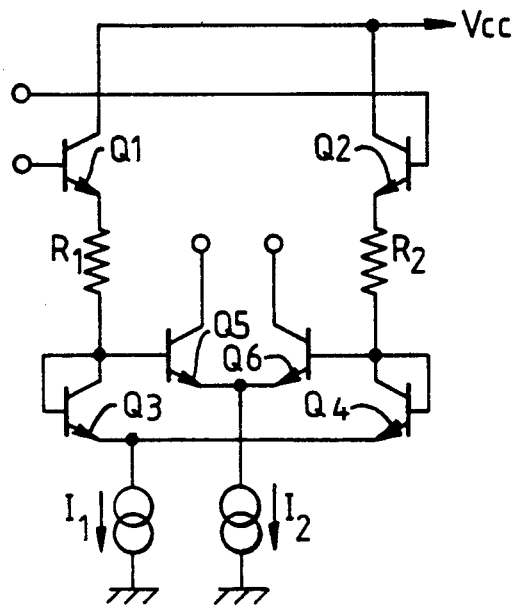
FIG. 1 is a circuit diagram showing a conventional adaptive current supply circuit.

The present invention will be described in detail with reference to the FIGS. 3 through 9. Throughout the drawings, reference numerals or letters used in FIGS. 1 and 2 will be used to designate like or equivalent elements for simplicity of explanation.

Figure 3:
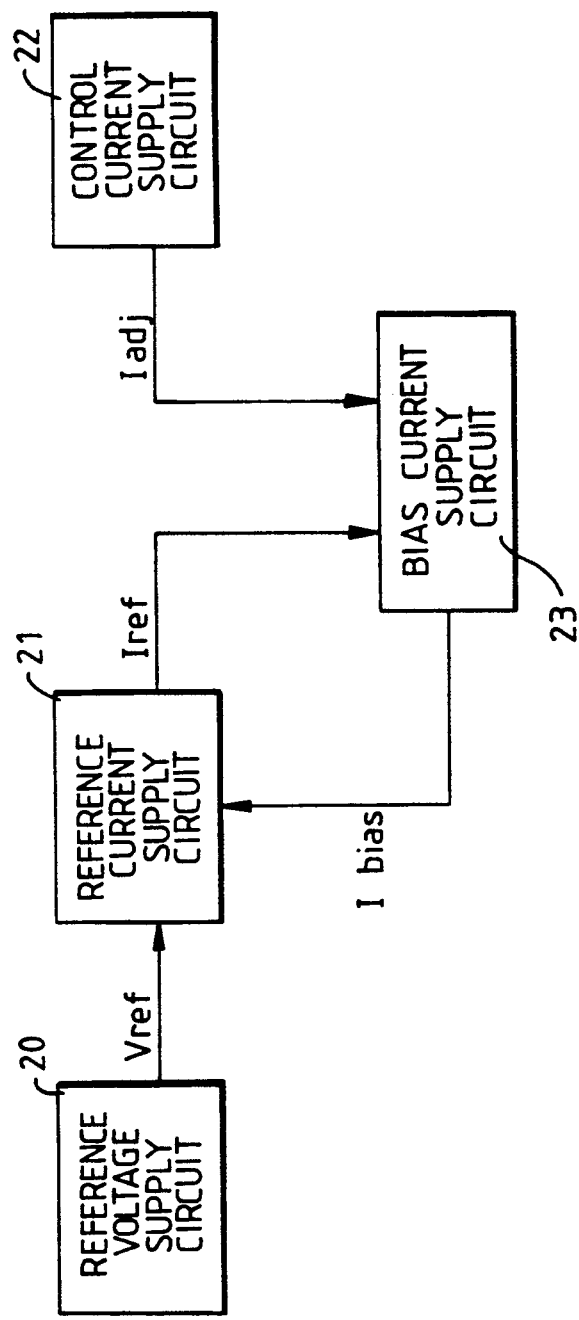
FIG. 3 is a block diagram showing a principal configuration of the adaptive current generating circuit according to the present invention.

Referring now to FIG. 3, a principal arrangement of the adaptive current generating circuit according to the present invention will be described in detail.

In FIG. 3, the adaptive current generating circuit comprises a reference voltage supply circuit 20, a reference current supply circuit 21, a control current supply circuit 22 and a bias current supply circuit 23. The reference voltage supply circuit 20 supplies the reference current supply circuit 21 with a reference voltage Vref subjected to a fluctuation of supply voltage. The reference current supply circuit 21 supplies the bias current supply circuit 23 with a reference current Iref responsive to the reference voltage Vref from the reference voltage supply circuit 20. The control current supply circuit 22 supplies the bias current supply circuit 23 with a control current Iadj subjected to a fluctuation of supply voltage.

The bias current supply circuit 23 supplies the reference current supply circuit 21 with a bias current Ibias which varies in response to a difference between the reference current Iref and the control current Iadj both supplied from the reference current supply circuit 21 and the control current supply circuit 22. The bias current Ibias can operate to compensate the fluctuation of the supply voltage so that the reference current Iref is adaptively adjusted, in spite of the fluctuation of the supply voltage. This will be described in more detail later.

Figure 4:
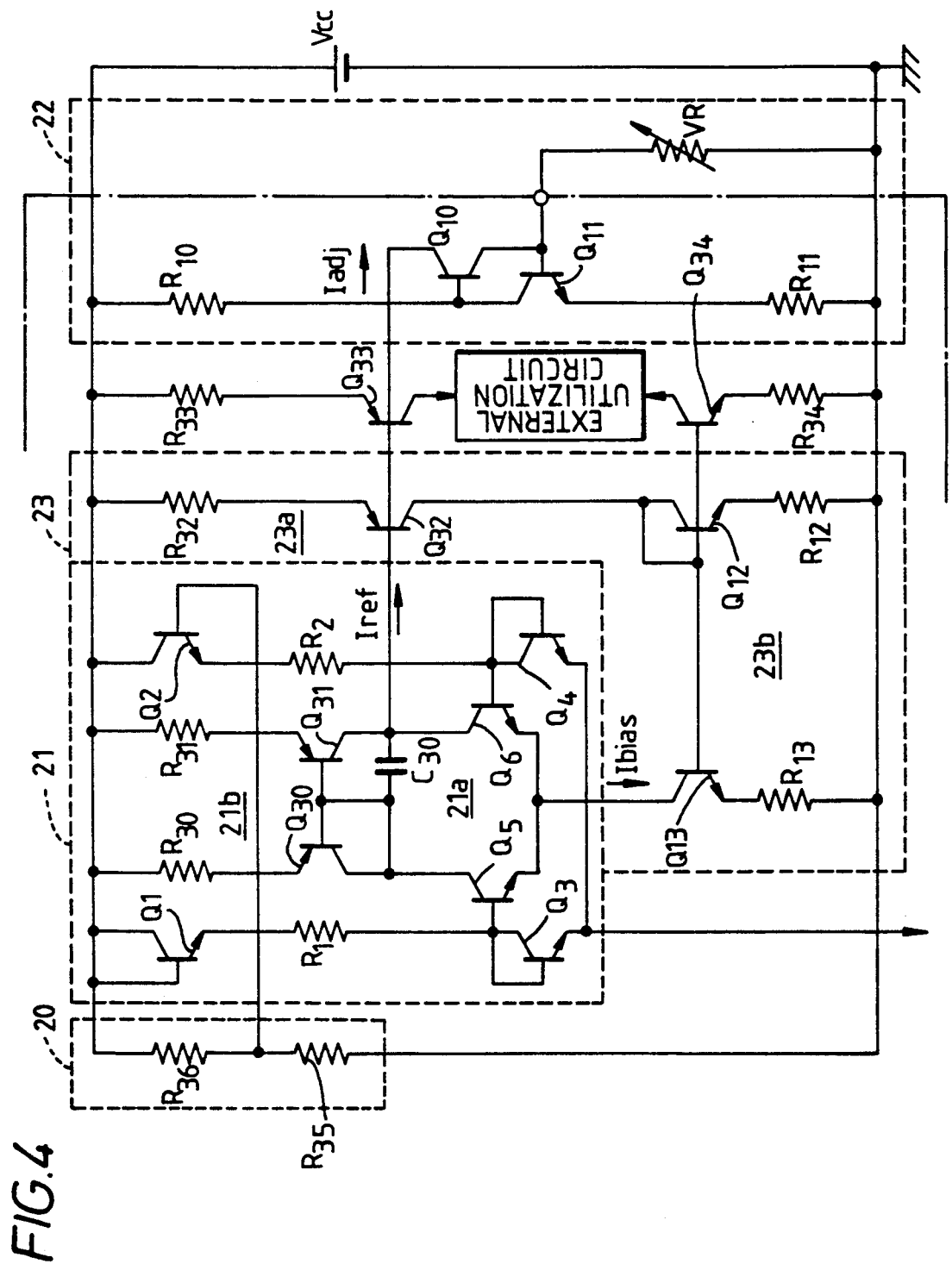
FIG. 4 is a circuit diagram showing an exemplary embodiment of the adaptive current generating circuit shown in FIG. 3.

FIG. 4 shows an exemplary embodiment of the adaptive current generating circuit of FIG. 3. In FIG. 4, the reference voltage supply circuit 20 is constructed by two resistors R35 and R36 which are connected in series across a power supply source for supplying a supply voltage Vcc. Hereinafter, the power supply source will be designated by also the term of Vcc. Thus the connection of the resistors R35 ad R36 generates the reference voltage Vref which is subjected to the fluctuation of supply voltage Vcc.

The reference current supply circuit 21 has a transconductance circuit 21a and a current mirror circuit 21b. The transconductance circuit 21a includes six transistors Q1 through Q6 and two resistors R1 and R2, while the current mirror circuit 21b which operates as a single end push-pull circuit, includes two transistors Q30 and Q31, two resistors R30 and R31, and a capacitor C30. The pair of transistors Q3 and Q4 is provided to receive a constant current I1 (not shown), while the pair of transistors Q5 and Q6 is provided to receive the bis current Ibias from the bias current supply circuit 23 as described later in detail.

Figure 2:
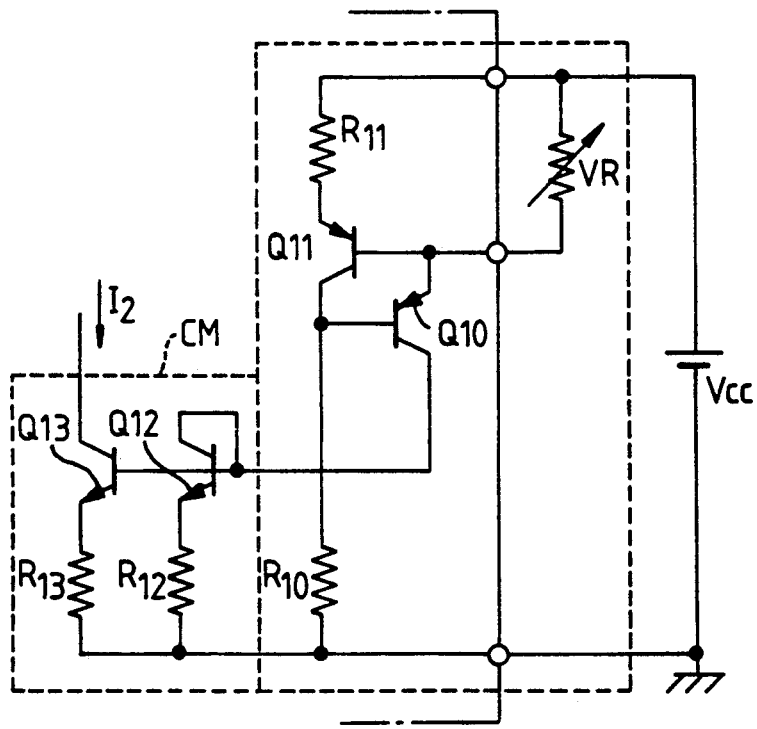
FIG. 2 is a circuit diagram showing a version of adaptive current source of FIG. 1.

In the transconductance circuit 21a, the six transistors Q1 through Q6 and two resistors R1 and R2 are connected in a manner as described in reference to the conventional gain cell circuit (see FIG. 1). Thus, the description of the circuit arrangement of the transconductance circuit 21a will be omitted herefrom for the simplicity of explanation.

In the current mirror circuit 21b, the collectors of the transistors Q30 ad Q31 with PNP configuration are connected to the collectors of the transistors Q5 and Q6 of the transconductance circuit 21a, respectively. On the other hand, the emitters of the transistors Q30 and Q31 are commonly connected to the power supply source Vcc through the resistors R30 and R31, respectively. The bases of the transistors Q30 and Q31 are connected to each other and then the common base connection is not only connected directly to the collector of the transistor Q5 of the transconductance circuit 21a, but also to the collector of the transistor Q6 of the transconductance circuit 21a through the capacitor C30. Thus, the reference current Iref responsive to the reference voltage Vref is obtained from the collector of the transistor Q31.

The control current supply circuit 22 includes two transistors Q10 and Q11, a variable resistor VR, and two resistors R10 and R11. The emitter of the transistor Q10 and the base of the transistor Q11 are coupled together and then connected to one end of the power supply cource Vcc through the variable resistor VR. While the base of the transistor Q10 and the collector of the transistor Q11 are coupled together and then connected to the other end of the power supply source Vcc through the resistor R10. The emitter of the transistor Q11 is also connected to the one end of the power supply source Vcc through the resistor R11. Thus the control current Iadj subjected to the fluctuation of the supply voltage Vcc is obtained from the collector of the transistor Q10.

The bias current supply circuit 23 has a current amplifying circuit 23a and a current mirror circuit 23b. The current amplifying circuit 23a includes a transistor Q32 with PNP configuration and a resistor R32. The emitter of the transistor Q32 is connected to the other end of the power supply source Vcc through the resistor R32, while the collector of the transistor Q32 is connected to the one end of the power supply source Vcc through the current mirror circuit 32b.

The current mirror circuit 32b includes two transistors Q12 and Q13 and two resistors R12 and R13. The collector of the transistor Q12 which is itself arranged in a diode fashion is coupled to the collector of the transistor Q32 of the current amplifying circuit 23a, while the emitter of the transistor Q12 is coupled to the one end of the power supply source Vcc through the resistor R12. On the other hand, the base of the transistor Q13 is coupled to the base of the transistor Q12, while the emitter of the transistor Q13 is coupled to the one end of the power supply source Vcc through the resistor R13. The collector of the transistor Q13 is connected to the common connection node of the emitters of the transistors Q5 and Q6.

In the bias current supply circuit 23, the base of the current amplifying transistor Q32 is coupled to both the collector of the transistor Q31 of the reference current supply circuit 21 and the collector of the transistor Q10 of the control current supply circuit 22 for receiving the reference current Iref and the control current Iadj. Thus, the bias current Ibias responsive to both the reference current Iref and the control current Iadj is obtained through the collector of the transistor Q13.

The transistor Q31 has the PNP configuration, while the transistor Q10 has the NPN configuration. Thus, the reference current Iref and the control current Iadj operate to the bias current supply circuit 23 in a push-pull relation. Accordingly, the current amplifying circuit 23a detects the difference between the reference current Iref and the control current Iadj. As a result, the bias current Ibias is reflected by the difference.

FIG. 4 further includes an additional current source circuit for supplying an external utilization circuit with a current associated with the adaptive current generating circuit of the present invention. The additional current source circuit comprises a transistor Q33 and a resistor R33, also, a transistor Q34 and a resistor R34, which are connected in series to one end of the power supply source Vcc and to the other end of the power supply source Vcc, respectively. Those elements are arranged in similar to the transistors Q32 and Q12 and the resistors R32 and R12 of the bias current supply circuit 23, except that the external utilization circuit is connected between the transistors Q33 Q34. Furthermore, the bases of the transistors Q33 and Q34 are coupled to the bases of the transistors Q32 and Q12, respectively.

Now assumed that the resistors R35 and R36 of the reference voltage supply circuit 20 have the same type of resistivity, the reference voltage Vref generated from the reference voltage supply circuit 20 will be represented as follows:

$$Vref = [R36/(R35 + R36)] \cdot Vcc = \alpha \cdot Vcc \tag{6}$$

(wherein $\alpha = R36/(R35 + R36)$)

As seen from the Equation 6, the reference voltage Vref depends on the supply voltage Vcc only.

Further, if the resistors R1 and R2 of the reference current supply circuit 21 have the same value of resistance R and the same value of differentiated emitter resistance Re, the reference current Iref obtained from the reference supply circuit 21 will be represented as follows:

$$\begin{aligned} Iref &= \{Vref \cdot Ibias/(R + 2 \cdot Re) \cdot I1\} \\ &= \{\alpha \cdot Vcc \cdot Ibias/(R + 2 \cdot Re) \cdot I1\} \\ &= \alpha \cdot Vcc \cdot gm \end{aligned} \tag{7}$$

On the other hand, the control current Iadj obtained from the control current supply circuit 22 is also represented as follows, provided that the base-to-emitter voltages Vbe of the transistors Q10 and Q11 are equal to each other, and their base currents are negligible small, and further the values of the resistor R10 and R11 are equal to each other;

$$Iadj = Vcc/2 \cdot VR \qquad (8)$$

Thus the reference voltage Vref depends on the supply voltage Vcc and the resistance of the variable resistor VR.

As the bias current supply circuit 23 performs a negative feedback control on the reference current Iref under the control of the bias current Ibias which is responsive to the reference current Iref and the control current Iadj, the reference current Iref will become equal to the control current Iadj (Iref=Iadj). Thus, the following equation will be established;

$$Ibias = \{(R + 2 \cdot Re) \cdot I\frac{1}{2} \cdot \alpha \cdot VR\} \qquad (9)$$

That is, as the term $\alpha (= R36/(R35+R36))$ is the voltage dividing ratio, the transconductance gm depends on the variable resistor VR only. As a result, by supplying a current generated in associated with the bias current Ibias to the same type transconductance circuits, all of their transconductances can be controlled by the variable resistor VR. In other words, the time constant C/gm of filter circuits can be kept constant by supplying such an external utilization circuit with the current from the additional current source circuit directly or indirectly. For example, the current can be supplied to transconductance circuits in addition to filter circuits.

If such transduction and/or filter circuits have been fabricated on IC chips, straggling of such transconductances and/or time constants their outputs can be minimized because of their excellent pairing property. Furthermore, as the transconductance gm is controllable to a desired characteristic by adjusting the variable resistor VR to optional characteristics or replacing the variable resistor VR with other impedance means, even when capacitances of capacitors used in filter circuits fluctuate, it is possible to eliminate the fluctuation.

Figure 5:
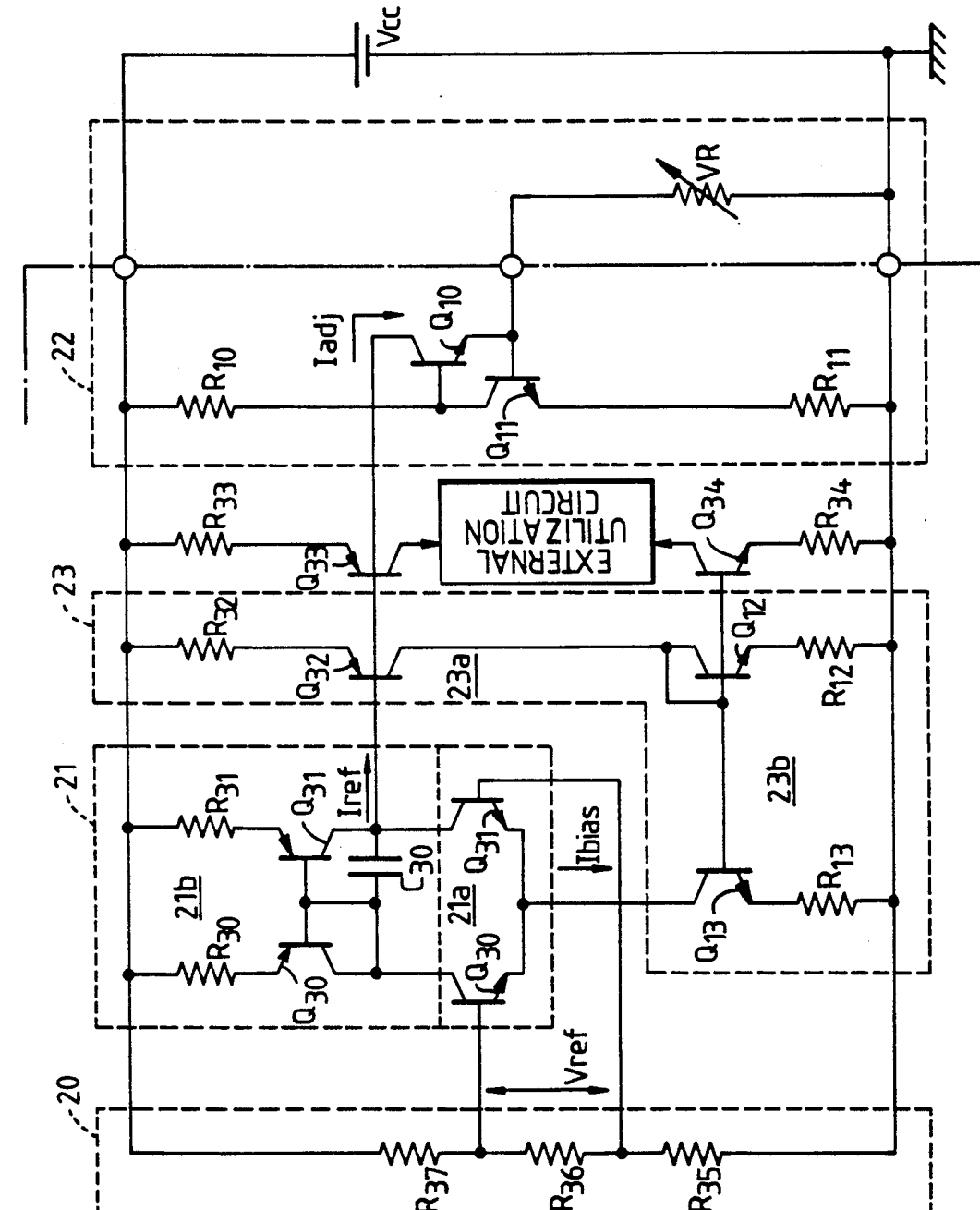
FIG. 5 is a circuit diagram showing another embodiment of the adaptive current generating circuit shown in FIG. 3.

FIG. 5 shown another exemplary embodiment of the adaptive current generating circuit of FIG. 3. The embodiment of FIG. 5 differs from the former embodiment of FIG. 4 by that the transconductance circuit 21a of FIG. 5 is realized by an emitter-coupled differential circuit including the transistors Q30 and Q31, and in addition, the reference voltage supply means 20 of FIG. 5 is realized by three resistors R35 through R37. Thus, the detailed description of the circuit arrangement of the present embodiment of FIG. 5 will be omitted herefrom for the simplicity of explanation.

According to the embodiment of FIG. 5, the reference voltage Vref obtained from the reference voltage supply means 20 is represented as follows;

$$\begin{aligned} Vref &= [R36/(R35 + R36 + R37)] \cdot Vcc \\ &= \alpha \cdot Vcc \end{aligned} \qquad (11)$$

(wherein $\alpha = R36/(R35 + R36 + R37)$)

The reference current Iref obtained from the reference current supply circuit 21 is represented as follows;
$$Iref = \alpha \cdot Vcc \cdot gm \qquad (12)$$

wherein the term gm represents the transconductance of the transconductance circuit 21a.

As the control current Iadj obtained from the control current supply circuit 22 is represented by the Equation 8, and that the relation of [Iref≃Vref] exists, the transconductance gm is represented as follows;

$$gm = \frac{1}{2} \cdot \alpha \cdot VR \qquad (13)$$

The equation 13 is equivalent to the Equation 10 as shown before. From this fact it will be easily understood that the transconductances gm of both the embodiments FIGS. 4 and 5 are freely controllable, regardless the type of the transconductance circuit.

The present invention is not limited only to those embodiments described above, but various applications are possible. For instance, the conduction type of the transistors utilized in the adaptive current generating circuit can be changeable between the NPN type and the PNP type.

Figure 6:
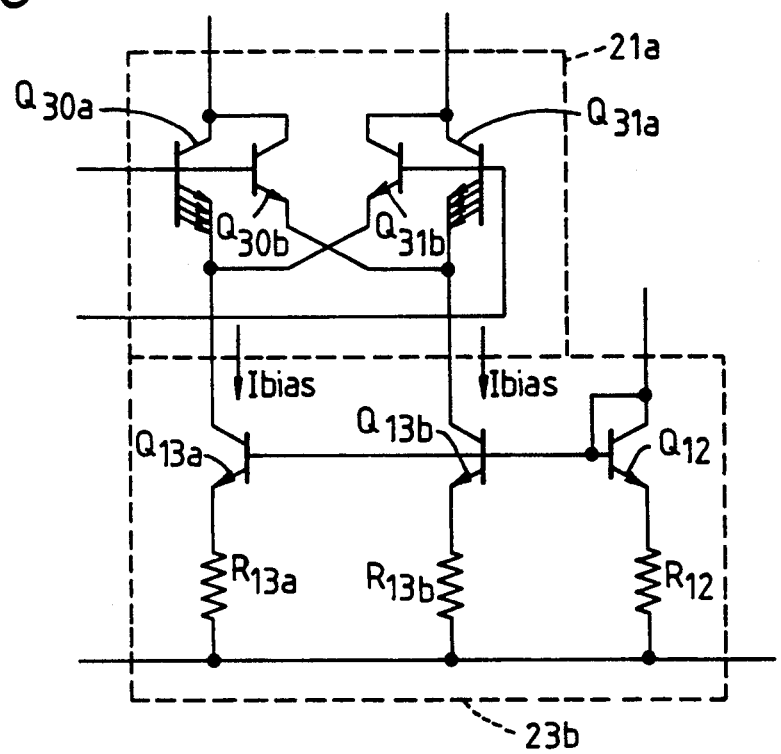
FIG. 6 is a circuit diagram showing alternative versions of a transconductance circuit and a current mirror circuit according to the present invention.

Further, the transconductance circuit 21a of the reference current supply circuit 21 and the current mirror circuit 23b of the bias current supply circuit 23 can be replaced by other versions shown together in FIG. 6. As shown in FIG. 6, such a version of the transconductance circuit 21a employs two pair of combinations of transistors with different emitter areas.

Figure 7:
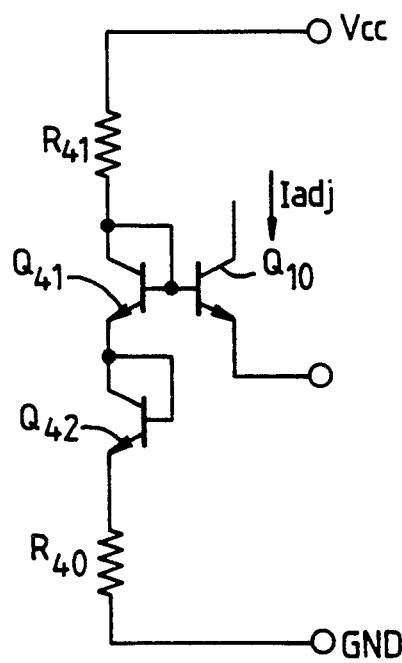
FIG. 7 is a circuit diagram showing another version of a control current supply circuit according to the present invention.

Furthermore, the control current supply circuit 22 can be replaced by also a version as shown in FIG. 7. As shown in FIG. 7, such a version of the control current supply circuit 22 includes three transistors Q10, Q41 and Q42 and two resistors R40 and R41. The resistor R41, the transistor Q41, the transistor Q42 and the resistor R40 are connected in series in the turn across the power supply source Vcc. The transistors Q41 and Q42 are themselves arranged in diode fashions. The transistor Q10 is coupled to the transistor Q41 so that they constitutes a control current supply circuit together. Then the emitter of the transistor Q10 is connected to the variable resistor (see FIG. 4 or 5) so that the control current Iadj is obtained through the collector of the transistor Q10.

Figure 8:
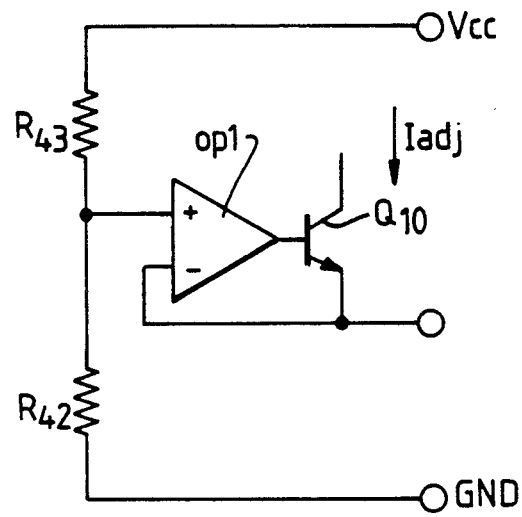
FIG. 8 is a circuit diagram showing another version of a control current supply circuit according to the present invention.

FIG. 8 shows still another version of the control current supply circuit 22. The version of FIG. 8 is constructed by a voltage follower circuit which includes two resistors R42 and R43 for dividing the supply voltage Vcc, an operational amplifier OP1 and a transistor Q10. The resistors R42 and R43 are coupled in series across the power supply source Vcc. The voltage dividing node of the series resistors R42 and R43 is coupled to the base of the transistor Q10 through the operational amplifier OP1.

Figure 9:
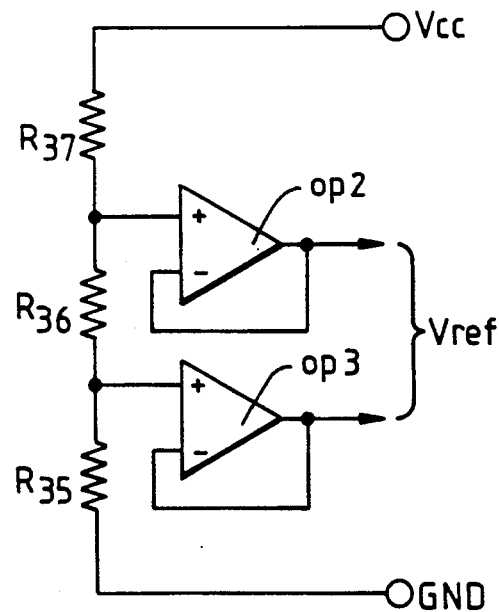
FIG. 9 is a circuit diagram showing another version of a reference voltage supply circuit according to the present invention.

FIG. 9 shows still another version of the reference voltage supply circuit 20. As shown in FIG. 9, this version of the reference voltage supply circuit 20 comprises three resistors R35 through R37 and two voltage followers constituted by operational amplifiers OP2 and OP3, respectively. Further, in case of transconductance circuits embodied by the using double balance circuits controllable their conductances according to a voltage, it is advisable to generate a bias voltage responsive to a difference between a reference current Iref and a control current Iadj, thereby controlling their transconductance with the bias voltage.

As mentioned above, the adaptive current generating circuit according to one aspect of the present invention is provided with reference voltage supply means for supplying a reference voltage subjected to a fluctuation of supply voltage, reference current supply means for supplying reference current responsive to the reference voltage supplied by the reference voltage supply means, control current supply means for supplying control current subjected to the fluctuation of the supply voltage, and bias supply means for supplying a bias to the current supply means corresponding to a difference between the reference current supplied by the reference current supply means and the control current supplied by the control current supply means, thereby compensating the fluctuation of the supply voltage.

In the adaptive current generating circuit in such construction as described above, the transconductance of the circuit is controlled based on a control current. Therefore, the transconductance can be stably controlled. Further, various transconductance circuits having different characteristics also can be controlled in the same manner.

As described above, according to the adaptive current generating circuit according to the present invention, it is possible to stably control a transconductance at a constant value or an optical value by generating and supplying the adaptively controlled current. In particular, stabilized filter characteristic is obtained when the circuit has been integrated together with an IC built-in filter.

As described above, the present invention can provide an extremely preferable adaptive current generating circuit.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. An adaptive current generating circuit comprising:
   a power supply for generating a power supply voltage;
   means for generating a reference voltage from said power supply voltage, said reference voltage generating means being subjected to a fluctuation of said power supply voltage;
   means for generating a reference current responsive to said reference voltage, said reference current generating means including a transconductance circuit;
   means for generating a control current from said power supply voltage, said control current being subjected to said fluctuation of the supply voltage; and
   means for generating a bias current corresponding to a difference between said reference current and said control current, and for supplying said bias current to said reference current generating means for controlling said reference current.

2. The adaptive current generating circuit of claim 1, wherein the reference voltage generating means comprises means for dividing said power supply voltage, said voltage dividing means including at least one resistor.

3. The adaptive current generating circuit of claim 1, wherein the reference current supply means contains a differential circuit and a single ended push-pull amplifier circuit.

4. The adaptive current generating circuit of claim 1, wherein the control current generating means includes an impedance including at least one resistor or variable resistor, means for supplying a voltage responsive to said power supply voltage to said impedance, and means for outputting a current from the impedance.

5. The adaptive current generating circuit of claim 1, wherein the bias supply means contains means for amplifying a difference between the reference current and the control current.

6. The adaptive current generating circuit of claim 1, said means for generating a reference current further including a current mirror.

* * * * *